United States Patent [19]

Borodovsky

[11] Patent Number: 4,580,332

[45] Date of Patent: Apr. 8, 1986

[54] FORMING A CONDUCTIVE, PROTECTIVE LAYER FOR MULTILAYER METALLIZATION

[75] Inventor: Yan A. Borodovsky, Fremont, Calif.

[73] Assignee: Advanced Micro Devices, Inc., Sunnyvale, Calif.

[21] Appl. No.: 593,335

[22] Filed: Mar. 26, 1984

[51] Int. Cl.[4] .......................................... H01L 21/58
[52] U.S. Cl. .................................. 29/589; 29/577 C; 156/656; 427/89
[58] Field of Search ........................ 29/589, 590, 591; 156/656, 657, 662, 665; 357/67, 71; 427/87, 89, 90

[56] References Cited

U.S. PATENT DOCUMENTS

| | | | |
|---|---|---|---|
| 2,873,216 | 2/1959 | Schnable | 357/71 |
| 4,172,004 | 10/1979 | Alcorn et al. | 357/71 |
| 4,289,574 | 9/1981 | Radigan et al. | 427/90 |
| 4,289,834 | 9/1981 | Alcorn et al. | 357/71 |
| 4,410,622 | 10/1983 | Dalal et al. | 156/665 |
| 4,415,606 | 11/1983 | Cynkar et al. | 357/67 |
| 4,507,852 | 4/1985 | Karulkar | 357/67 |

OTHER PUBLICATIONS

H. Okimura, C. R. Kannewurf and J. O. Brittain, "Preparation and Electrical Properties of InAs Thin Films", *Journal of Electronic Materials*, vol. 7, No. 5, 1978, pp. 627–637.

U.S. patent application Ser. No. 722,957, filed Apr. 12, 1985 of Borodovsky et al.

*Primary Examiner*—Brian E. Hearn
*Assistant Examiner*—John Callahan
*Attorney, Agent, or Firm*—Patrick T. King; John P. Taylor; J. Vincent Tortolano

[57] ABSTRACT

An improved integrated circuit structure, and method of making the structure, is disclosed wherein at least one metallization layer is coated with a conductive indium arsenide layer during production of the structure and an upper metallization layer subsequently is applied to the structure wherein at least a portion of the subsequent metallization layer is in ohmic contact with the conductive indium arsenide layer whereby the lower metallization layer is protected by the intervening indium arsenide layer during subsequent removal of the upper metallization layer if subsequent reworking of the structure becomes necessary. The use of the indium arsenide layer over a metallization layer further enhances the construction process by the use of its antireflective properties during patterning of a photoresist applied over the indium arsenide layer.

10 Claims, 4 Drawing Figures

FORMING A CONDUCTIVE, PROTECTIVE LAYER FOR MULTILAYER METALLIZATION

BACKGROUND OF THE INVENTION

1. Field of the Invention

This invention relates to the production of integrated circuit devices. More particularly, this invention relates to a conductive layer which may be used in between metallization layers to permit subsequent selective removal of the overlying metallization layer, if necessary, for rework.

2. Description of the Prior Art

During construction of an integrated circuit device, it would sometimes be desirable to rework the structure due to some mistake or error in an upper layer. Reworking, rather than scrapping the wafer, would be economically desirable when a number of correctly constructed lower layers have already been applied beneath the problem layer. However, when two or more metallization layers are already present in the structure and the two layers are in electrical contact with one another due to openings which have already been made in intervening layers, selective removal of the upper metal layer, without damage to the lower metallization layer, would be difficult, if not impossible. When the lower metallization layer is damaged in attempting to remove the upper metallization layer, removal of the intervening oxide layers is necessitated as well. However, since the etchants which would be used to remove intermediate oxides would also remove lower oxide portions in underlying transistor structures formed in the silicon wafer, the wafer, in essence, cannot, in such instances, usually be reworked and must be scrapped.

There, therefore, exists a need for a construction which will permit the necessary electrical connection between two or more metallization layers without interfering or inhibiting the subsequent removal of the outermost of the layers if it later becomes necessary to rework the structure.

SUMMARY OF THE INVENTION

It is therefore an object of the invention to provide an improved integrated circuit structure and a method for making the structure wherein a conductive member is applied between two metalization layers which will permit subsequent selective removal of the upper metallization layer without disturbance to the lower metallization layer.

It is another object of the invention to provide an improved integrated circuit structure and a method for making the structure wherein a conductive member is applied between two metalization layers which will provide a conductive path between the metallization layers without introducing any substantially added resistance between the metallization layers through the conductive path.

It is yet another object of the invention to provide an improved integrated circuit structure and a method for making the structure wherein a conductive member is applied between two metalization layers which will protect the lower metallization layer during subsequent selective removal of the upper metallization layer.

It is a further object of the invention to provide an improved integrated circuit structure and a method for making the structure wherein a conductive member is applied between two metalization layers which will protect the lower metallization layer, during a subsequent selective removal of the upper metallization layer, from the means used to remove the upper metallization layer.

It is yet a further object of the invention to provide an improved integrated circuit structure and a method for making the structure wherein a conductive member is applied between two metalization layers which will enhance the process of forming further layers over the conductive layer as well as permit subsequent selective removal of the upper metallization layer, if necessary, without disturbance to the lower metallization layer by protecting the lower metallization layer from the means used to remove the upper metallization layer.

These and other objects of the invention will be apparent from the accompanying drawings and description.

In accordance with the invention, an improved integrated circuit structure, and method of making the structure, is provided which comprises at least one metallization layer having a conductive indium arsenide layer applied thereon during production of the structure and an upper metallization layer subsequently applied to the structure wherein at least a portion of the subsequent metallization layer is in ohmic contact with the conductive indium arsenide layer whereby the lower metallization layer is protected by the intervening indium arsenide layer during subsequent removal of the upper metallization layer if subsequent reworking of the structure becomes necessary. The use of the indium arsenide layer over a metallization layer further enhances the construction process by the use of its antireflective properties during patterning of a photoresist applied over the indium arsenide layer.

DESCRIPTION OF THE PREFERRED EMBODIMENTS

Figure 1:
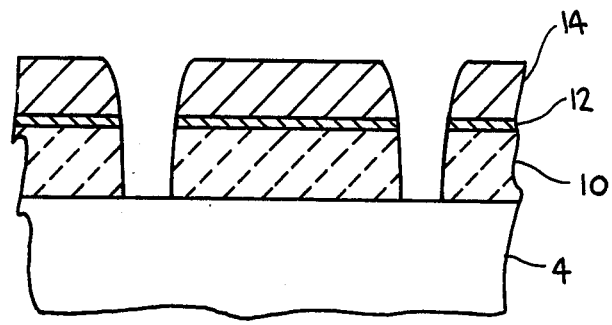
FIG. 1 is a cross sectional view of an integrated circuit structure in an intermediate stage of construction showing the indium arsenide applied over a first metallization layer.
Figure 2:
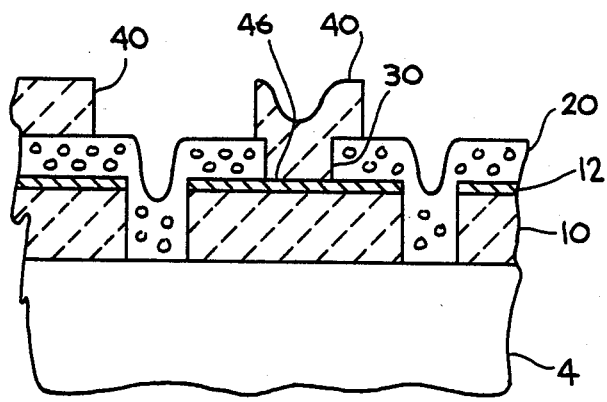
FIG. 2 is a cross sectional view illustrating the structure shown in FIG. 1 after removal of photoresist and deposition of a subsequent oxide layer and a second metallization layer.
Figure 3:
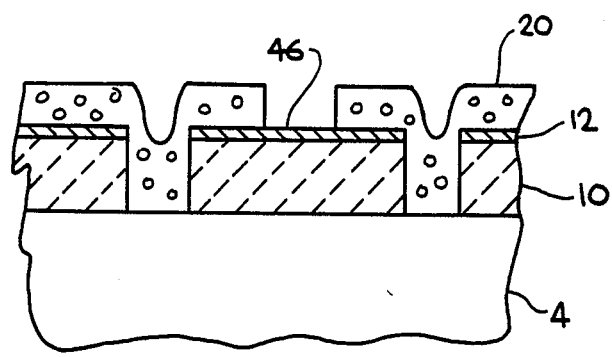
FIG. 3 is a cross-sectional view of the structure shown in FIG. 2 after the second metallization layer has been removed.

Referring now to FIGS. 1-3, the invention will be illustrated in a simplified form. In FIG. 1, an intermediate stage of manufacturing of an integrated circuit is shown. A metallization layer 10 which may, for example, comprise aluminum is shown applied over an underlying structure 4. A layer 12 of indium arsenide has been applied over metallization layer 10, for example, by sputtering to a thickness of at least 500 angstroms. A layer 14 of photosensitive material or "photoresist" is then applied over the indium arsenide layer and exposed to a pattern of light thru a mask. The photoresist is then developed to remove the exposed portions, and the underlying portions of indium arsenide and aluminum segments so uncovered are removed.

The indium arsenide segments may be removed by treating the indium arsenide with a solution comprising 1 volume part bromine in 100 volume parts acetic acid and 100 volume parts water. The now exposed aluminum is then etched away by conventional wet or dry etching techniques such, for example, a 20% aqueous KOH solution at 65° C.

As shown in FIG. 2, an oxide layer 20 may then be applied and then patterned to open a contact 30. A second metallization layer 40, such as another layer of aluminum, is then deposited and patterned. The necessary interconnection between the first and second metallization layers are supplied through the openings in the oxide layer therebetween to provide a contact at 46 between layer 40 and the underlying indium arsenide 12. This, in turn, provides the desired conductive path between first metallization layer 10 and second metallization layer 40. As shown in FIG. 2, metallization layer 40 may also be patterned for application of subsequent layers of the integrated circuit structure.

During the various construction steps which may occur after application of second metallization layer 40, an error may occur, such as an improperly aligned patterning or over etching, etc., which necessitates reworking including removal of such upper layers (as an alternate to scrapping of the wafer) including metallization layer 40. Previously, this would have presented a problem because of the direct connection between metallization layers 10 and 40.

In accordance with the invention, however, as illustrated in FIG. 3, layer 40 may be removed with a chemical etch such as KOH which will not attack the indium arsenide layer overlying first metallization layer 10 at contact point 46. Thus first metallization layer 10 is protected from the etchant by the presence of intervening indium arsenide layer 12.

While metallization layers 10 and 40 have been illustrated as comprising aluminum because of its common usage in the industry, other materials including aluminum alloys and polysilicon may also be used in place of aluminum without any loss in the advantages provided by the invention. The use of the term "metallization" herein is therefore defined as including not only metals, by other materials which, either naturally or becausing of doping, have a conductivity approaching that of a metal conductor.

Similarly, wet etchants other than the illustrated KOH may be used to selectively remove an upper metallization layer without attacking the underlying indium arsenide layer including acids such as, for example, mineral acids such as nitric or hydrochloric acid. When acids are used, and particularily mineral acids, it is preferable to etch at about room temper ature to avoid damage to other materials on the wafer.

The indium arsenide layer should have a minimum thickness of about 500 angstroms to provide a sufficient amount of protection chemically for the underlying metallization layer. Since indium arsenide has a resistivity of about 20 milli ohms×centimeter, the thickness of the indium arsenide layer should not exceed 10000 angstroms to avoid adding an undesirable amount of resistance to the interconnection of the underlying metallization layer through the indium arsenide layer to the upper metallization layer. The use of indium arsenide over a metallization layer has an additional advantage due to the antireflective or absorptive properties of indium arsenide. Thus patterning of a photoresist layer applied over a metallization layer having a coating of indium arsenide thereon, can be done more accurately because of the reduction of the amount of light reflected back into the photoresist due to the presence of the indium arsenide layer.

Figure 4:
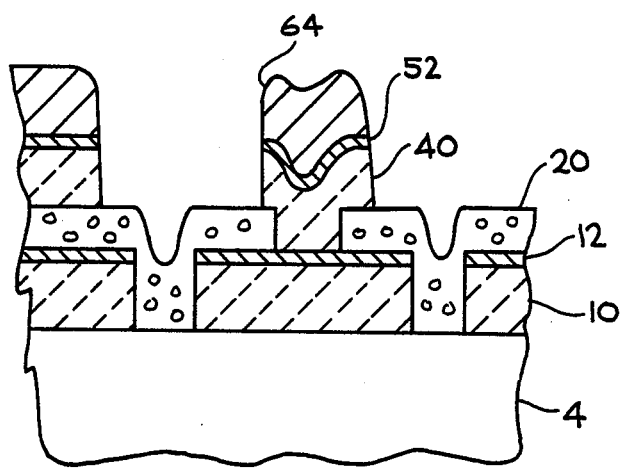
FIG. 4 is a cross sectional view illustrating the structure shown in FIG. 2 with an indium arsenide layer applied to the second metallization layer in preparation for subsequent application of a third metallization layer.

It should be further noted that the use of indium arsenide over a metallization layer need not be limited to a single layer. As shown in FIG. 4, second metallization layer 40 may also have an indium arsenide layer 52 thereon in contemplation of subsequent application of a third metallization layer which will be chemically isolated from metallization layer 40 by indium arsenide layer 52. As shown in FIG. 4, a further photoresist layer 64 has already been applied and selectively developed over indium arsenide layer 52 in contemplation of the deposition of further integrated circuit layers including one or more further metallzation layers.

Thus the invention provides an improved integrated circuit structure and method of making the structure wherein the inclusion of a conductive layer of indium arsenide over a metallization layer provides electrical coupling to an upper metallization layer while isolating the two layers chemically to permit selective removal of the upper metallization layer without disturbance of the lower metallization layer thus permitting economical reworking of a defective wafer which may not have been possible heretofore in many instances.

Having thus described the invention, what is claimed is:

1. A method of constructing an integrated circuit structure wherein an upper metallization layer, conductively coupled to a lower metallization layer beneath said upper metallization layer, may be selectively removed without removal of said lower metallization layer for purposes of reworking one or more portions of said integrated circuit structure during construction to increase the yield which comprises:
    (a) applying a conductive coating of indium arsenide over said lower metallization layer; and
    (b) applying said upper metallization layer over said indium arsenide coating wherein at least a portion of said indium arsenide coating is in direct contact with said upper whereby said upper metallization layer is removable by wet etching means without removal of said lower metallization layer by said indium arsenide coating providing an etchant barrier to protect said lower metallization layer from the etching means used to remove said upper metallization layer.

2. The method of claim 1 wherein said upper metallization layer is removable by etching with an alkali metal hydroxide which will dissolve said upper metallization layer without substantially attacking said indium arsenide layer.

3. The method of claim 2 wherein said alkali metal hydroxide comprises potassium hydroxide.

4. The method claim 1 wherein said etchant comprises an acid.

5. The method of claim 1 wherein said etchant comprises a mineral acid.

6. the method of claim 5 wherein said mineral acid comprises hydrochloric acid.

7. The method of claim 5 wherein said metal is etched with said mineral acid at about room tempera- ture.

8. The method of claim 1 wherein at least one of said metallization layers is selected from the class consisting of aluminum and aluminum alloys.

9. The method of claim 1 wherein at least one of said metallization layers comprises polysilicon.

10. The method of claim 1 wherein said indium arsenide is applied to a thickness of at least 500 angstroms.

* * * * *